(12) United States Patent
Okamura

(10) Patent No.: US 7,566,972 B2
(45) Date of Patent: Jul. 28, 2009

(54) SEMICONDUCTOR DEVICE AND METHOD FOR MANUFACTURING THE SEMICONDUCTOR DEVICE

(75) Inventor: Hiroshi Okamura, Mikawa (JP)

(73) Assignee: Seiko Epson Corporation (JP)

( * ) Notice: Subject to any disclaimer, the term of this patent is extended or adjusted under 35 U.S.C. 154(b) by 166 days.

(21) Appl. No.: 11/426,385

(22) Filed: Jun. 26, 2006

(65) Prior Publication Data

US 2007/0026663 A1 Feb. 1, 2007

(30) Foreign Application Priority Data

Jul. 13, 2005 (JP) ............................. 2005-204041

(51) Int. Cl.
*H01L 23/48* (2006.01)
*H01L 23/52* (2006.01)
*H01L 29/40* (2006.01)

(52) U.S. Cl. ................. 257/751; 257/763; 257/775; 257/E23.01; 257/E23.019

(58) Field of Classification Search ................. 438/643, 438/618, 637, 250; 257/635, 775, 763, 751, 257/E23.01, E23.019
See application file for complete search history.

(56) References Cited

U.S. PATENT DOCUMENTS

| | | | |
|---|---|---|---|
| 5,739,579 A * | 4/1998 | Chiang et al. ............... 257/635 |
| 6,140,236 A | 10/2000 | Restaino et al. | |
| 6,197,684 B1 * | 3/2001 | Wang ........................ 438/643 |
| 6,271,112 B1 * | 8/2001 | Wooten et al. ............... 438/618 |
| 6,358,792 B1 * | 3/2002 | Hsue et al. ................... 438/250 |
| 6,414,395 B1 | 7/2002 | Ookuma et al. | |
| 7,375,026 B2 * | 5/2008 | Rhodes ........................ 438/637 |

FOREIGN PATENT DOCUMENTS

| | | |
|---|---|---|
| CN | 1234606 | 11/1999 |
| JP | 04-192545 | 7/1992 |
| JP | 05-343531 | 12/1993 |
| JP | 06-120353 | 4/1994 |
| JP | 09-055474 | 2/1997 |
| JP | 09-199593 | 7/1997 |
| JP | 09-283624 | 10/1997 |
| JP | 2000-332103 | 11/2000 |
| JP | 2003-203974 | 7/2003 |
| JP | 2004-363447 | 12/2004 |

OTHER PUBLICATIONS

Hiroshi Okamura and Shinichi Ogawa, Low Damage Via Formation with Low Resistance by NH3 Thermal Reduction for CU/Ultra Low-k Interconnects.

* cited by examiner

*Primary Examiner*—Davienne Monbleau
*Assistant Examiner*—Monica D Harrison
(74) *Attorney, Agent, or Firm*—Harness, Dickey & Pierce, P.L.C.

(57) ABSTRACT

A semiconductor device, comprises: a wiring formed on a first insulating film, a second insulating film formed on the first insulating film and on the wiring, a contact hole formed in the second insulating film and located on the wiring, a coating that covers a sidewall of the contact hole and is formed by sputtering the wiring at the bottom of the contact hole, a barrier film formed on the coating and at the bottom of the contact hole, and an electrical conductor deposited in the contact hole.

13 Claims, 4 Drawing Sheets

(A)

(B)

SEMICONDUCTOR DEVICE AND METHOD FOR MANUFACTURING THE SEMICONDUCTOR DEVICE

The entire disclosure of Japanese Patent Application No. 2005-204041, filed on Jul. 13, 2005 is expressly incorporated by reference herein.

BACKGROUND

1. Technical Field

The present invention relates to a semiconductor device in which upper and lower wiring layers are connected through a contact hole and a method for manufacturing the semiconductor device. In particular, this invention relates to a semiconductor device that can improve wiring reliability at a contact hole and a method for manufacturing the semiconductor device.

2. Related Art

FIGS. 4A, 4B and 4C are sectional views for explaining an example of related art for a method for manufacturing a semiconductor device. The semiconductor device manufactured by this example has upper and lower wiring layers that are connected by a tungsten plug.

First, as shown in FIG. 4A, a first wiring layer 120 is formed on an insulating film 110. The first wiring layer 120 has a structure in which a barrier film 121, an Al alloy film 122 and an antireflection film 123 are deposited in this order. The antireflection film 123 has a structure in which a Ti film and a TiN film are deposited in this order. Subsequently, an interlayer insulating film 130 that is mainly made of silicon oxide is formed on the insulating film 110 and the first wiring layer 120. Then, after a surface of the interlayer insulating film 130 is planarized, a contact hole 130a is formed in the interlayer insulating film 130 to be on the first wiring layer 120.

After the above process, a residue from etching remains on a surface of the antireflection film 123 at the bottom of the contact hole 130a. Further, an oxide layer is formed on the surface of the antireflection film 123 because of an air exposure. Therefore, the first wiring layer 120 that is exposed at the bottom of the contact hole 130a is sputtered with Ar plasma. Thus the residue remaining on the surface of the antireflection film 123 and the oxide layer are removed. The removed residue and oxide layer attach to the sidewall of the contact hole 130a as an island-like oxide 131.

Subsequently, a barrier film 141 made of TiN is formed on the interlayer insulating film 130, and also on the sidewall and the bottom surface of the contact hole 130a. Due to the attachment of the island-like oxide 131 to the sidewall of the contact hole 130a, coverage of the barrier film 141 around the oxide 131 may decrease.

Next, as shown in FIG. 4B, a tungsten film 142 is formed on the barrier film 141 and in the contact hole 130a by chemical vapor deposition (CVD). As a raw material gas, Tungsten Hexafluoride ($WF_6$) is used. In a case where coverage of the barrier film 141 on the sidewall of the contact hole 130a is insufficient and the interlayer insulating film 130 is partially exposed, the tungsten film 142 comes in contact with the interlayer insulating film 130 directly at this exposed section 130b. However, because adhesion of these two films is insufficient, an air gap 130c is made between the tungsten film 142 and the interlayer insulating film 130 on the exposed section 130b.

Then, as shown in FIG. 4C, the tungsten film 142 and the barrier film 141 on the interlayer insulating film 130 are removed, which completes a tungsten plug 140 deposited in the contact hole 130a. Subsequently, a second wiring layer 150 is formed on the interlayer insulating film 130 to be on the tungsten plug 140. The second wiring layer 150 has a structure in which a barrier film 151, an AlCu alloy film 152 and an antireflection film 153 are deposited in this order (as referred to the second paragraph of JP-A-9-283624 as an example of related art).

As mentioned above, when an island-like oxide adheres to a sidewall of a contact hole, a partial gap may be made between the sidewall of the contact hole and an electrical conductor in a process to deposit the electrical conductor (a tungsten plug for example) into the contact hole. In this case, connection reliability (stress migration characteristics or electromigration characteristics for example) at the contact hole decreases.

As another case where an island-like oxide adheres to a sidewall of a contact hole, a barrier film may be detached from the sidewall of the contact hole and thus wiring reliability (stress migration characteristics or electromigration characteristics for example) at the contact hole may decrease.

SUMMARY

An advantage of the invention is to provide a semiconductor device that can improve connection reliability at a contact hole and a method for manufacturing the semiconductor device.

A semiconductor device according to an aspect of the invention includes: a wiring formed on a first insulating film, a second insulating film formed on the first insulating film and the wiring, a contact hole formed in the second insulating film and located on the wiring, a coating that is formed by sputtering the wiring at the bottom of the contact hole and covers a sidewall of the contact hole, a barrier film formed on the coating and at the bottom of the contact hole, and an electrical conductor deposited in the contact hole.

In a case of this semiconductor device, the barrier film is contiguously formed on the sidewall of the contact hole as the sidewall has been covered with the coating. Consequently, an air-gap forming between the sidewall of the contact hole and the electrical conductor is prevented in a process to deposit the electrical conductor. Connection reliability at the contact hole is thus improved.

In a case where the wiring has a structure in which an Al alloy film, a Ti film and a TiN film are deposited in this order, the coating is formed by sputtering the TiN film. Further, in a case where the wiring at the bottom of the contact hole has a structure in which an Al alloy film and a Ti film are deposited in this order, the coating is formed by sputtering the Ti film and the Al alloy film. In a case where the wiring has a structure in which an Al alloy film, a Ti film and a TiN film are deposited in this order, the coating is formed by sputtering the TiN film and Ti film. In a case where an Al alloy film is exposed on the upper surface of the wiring at the bottom of the contact hole, the coating is formed by sputtering the Al alloy film.

A semiconductor device according to another aspect of the invention includes: a wiring formed on a first insulating film, a second insulating film formed on the first insulating film and the wiring, a contact hole formed in the second insulating film and located on the wiring, a coating that covers a sidewall of the contact hole and is progressively thinner from bottom to top, a barrier film formed on the coating and at the bottom of the contact hole, and an electrical conductor deposited in the contact hole.

According to this semiconductor device, there is a case where the coating includes Ti and O or a case where the coating includes Al and O.

As for each semiconductor device mentioned above, the coating may cover two-thirds or more of a region from the bottom of the contact hole, and part of the sidewall of the contact hole where the coating is not formed can be covered with the barrier film.

A method for manufacturing a semiconductor device according to yet another aspect of the invention includes: forming a wiring on a first insulating film, forming a second insulating film on the first insulating film and on the wiring, forming a contact hole in the second insulating film to be on the wiring, forming a coating on a sidewall of the contact hole by sputtering the wiring at the bottom of the contact hole, forming a barrier film on the second insulating film and on the coating, and depositing a conductive film in the contact hole.

The process to deposit the conductive film can include forming the conductive film in the contact hole and on the second insulating film by CVD and removing the conductive film on the second insulating film.

The second insulating film is, for example, a silicon oxide film, and the conductive film is, for example, a tungsten film. In this case, a raw material gas to form the tungsten film includes Tungsten Fluoride.

BRIEF DESCRIPTION OF THE DRAWINGS

The invention will be described with reference to the accompanying drawings, wherein like numbers reference like elements.

DESCRIPTION OF THE EMBODIMENTS

Embodiments of the invention will be described as follows with reference to the accompanying drawings. FIGS. 1A, 1B, 1C, 2A and 2B are sectional views for explaining a method for manufacturing a semiconductor device according to a first embodiment of the invention. This method is to connect a first wiring layer and a second wiring layer above the first wiring layer by a tungsten plug.

Figure 1:
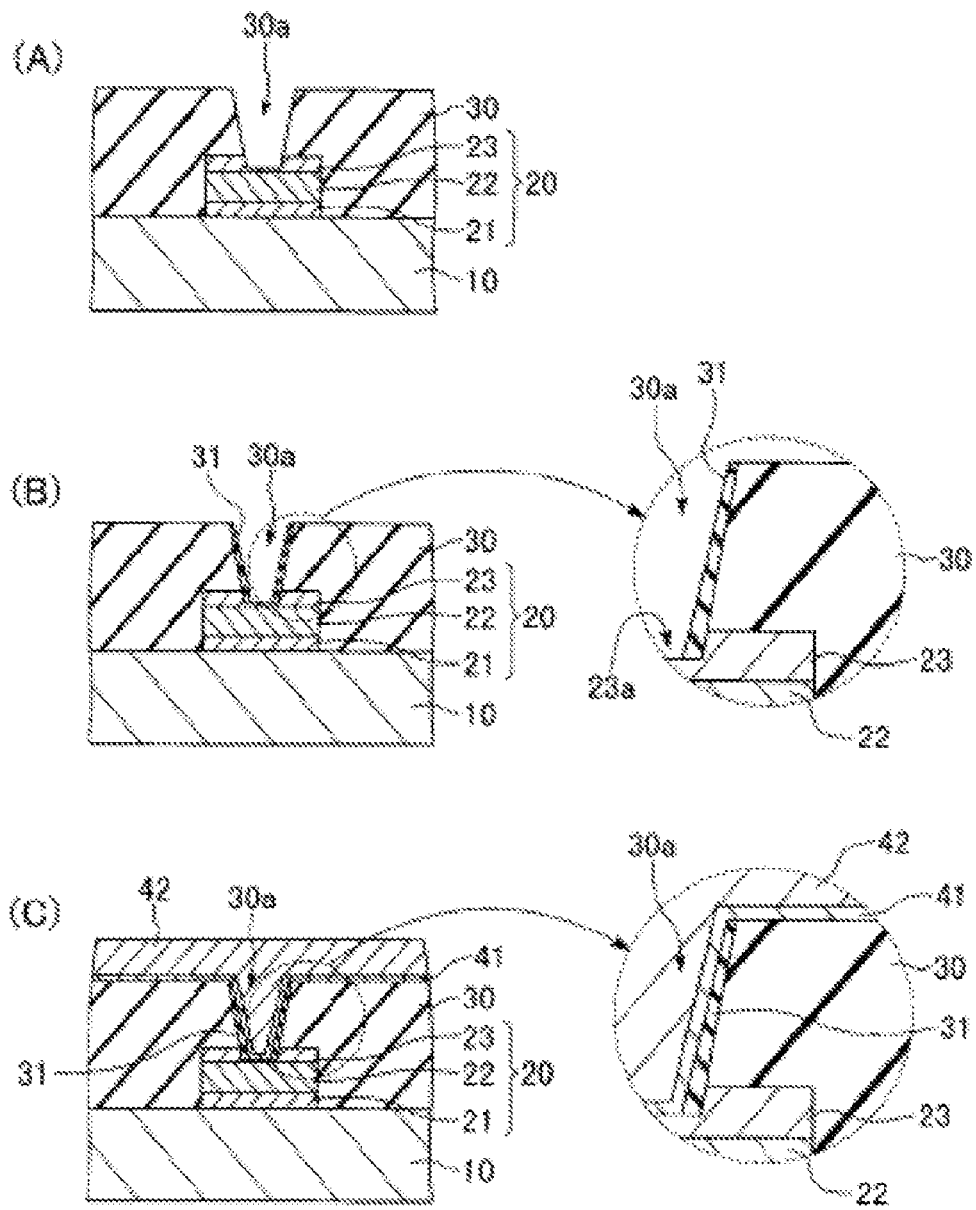
FIG. 1A is a sectional view for explaining a method for manufacturing a semiconductor device according to a first embodiment of the invention.
FIG. 1B is a sectional view for explaining a process subsequent to FIG. 1A.
FIG. 1C is a sectional view for explaining a process subsequent to FIG. 1B.

First, as shown in FIG. 1A, an insulating film 10 is formed on or above a silicon substrate (not shown). The insulating film 10 is, for example, an interlayer insulating film. Next, a barrier film 21, an AlCu alloy film 22 and an antireflection film 23 are deposited in this order on the insulating film 10. The barrier film 21 is a TiN film, and the antireflection film 23 is formed by depositing a Ti film and a TiN film in this order. For each layer, the TiN film is formed by reactive sputtering whereas the Ti film is formed by sputtering. The AlCu alloy film 22 is also formed by sputtering. The thickness of the TiN film of the antireflection film 23 is 20 nm or more and 150 nm or less, for example.

Next, a photoresist film (not shown) is applied to the antireflection film 23, and then the photoresist film is exposed and developed. A resist pattern is thus formed on the antireflection film 23. Then, the antireflection film 23, the AlCu alloy film 22 and the barrier film 21 are etched by using this resist pattern as a mask. A first wiring layer 20 is thus formed on the insulating film 10. The resist pattern is removed thereafter.

Subsequently, an interlayer insulating film 30 mainly made of silicon oxide is formed on the insulating film 10 and the first wiring layer 20 by CVD. Then, a surface of the interlayer insulating film 30 is planarized by chemical mechanical polishing (CMP). The thickness of the interlayer insulating film 30 on the first wiring layer 20 is 400 nm or more and 1200 nm or less, for example.

Next, a photoresist film (not shown) is applied to the interlayer insulating film 30, and then the photoresist film is exposed and developed. A resist pattern is thus formed on the interlayer insulating film 30. Then, the interlayer insulating film 30 is etched by using this resist pattern as a mask. Thus a contact hole 30a is formed in the interlayer insulating film 30 so as to be on the first wiring layer 20. The diameter of the contact hole 30a is 100 nm or more and 500 nm or less, for example.

Then, the resist pattern is removed. In this process of resist pattern removal or the like, a surface of the antireflection film 23 of the first wiring layer 20 is oxidized and becomes to have high resistance.

Subsequently, as shown FIG. 1B, Ar is excited by inductively coupled plasma (ICP) and converted to plasma. The contact hole 30a is exposed to this plasma. Input energy to generate plasma is, for example, 500 w, and the gas pressure is, for example, 0.7 mTorr. Further, the silicon substrate on which the insulating film 10 and so on are formed is heated only by plasma. Accordingly, a surface of the antireflection film 23 of the first wiring layer 20 at the bottom of the contact hole 30a is sputtered and a concave portion 23a is formed. As a result, the high-resistance layer formed on the surface of the antireflection film 23 is removed.

The sputtering of the antireflection film 23 is performed as far as the depth of the concave portion 23a becomes 1 nm or more and 20 nm or less, for example. A sputtered substance thus adheres to a sidewall of the contact hole 30a as a coating 31. The coating 31 is progressively thinner from bottom to top. In this embodiment, the coating 31 is formed on the whole surface of the sidewall of the contact hole 30a. However, the coating 31 needs to be formed to cover only two-thirds or more of the sidewall from the bottom thereof. The thickness of the coating 31 is preferably, for example, 1 nm or more and 2 nm or less in the center section of the contact hole 30a. The coating 31 includes Ti, O and N.

Next, as shown in FIG. 1C, a barrier film 41 is formed on the interlayer insulating film 30 and in the contact hole 30a. The barrier film 41 is a TiN film, for example, and formed by reactive sputtering. Unlike an island-like oxide in related art, the coating 31 is formed on the sidewall of the contact hole 30a. Therefore, the barrier film 41 is contiguously formed on the whole surface of the sidewall of the contact hole 30a. Accordingly, coverage of the barrier film 41 is improved compared to related art. In addition, in a case where the coating 31 has not been formed on the upper section of the sidewall of the contact hole 30a, the barrier film 41 is formed directly on the sidewall at the upper section of the contact hole 30a.

Subsequently, a tungsten film 42 is formed on the barrier film 41 and in the contact hole 30a by CVD. As a raw material gas, Tungsten Hexafluoride ($WF_6$) is used. Since coverage of the barrier film 41 is improved compared to related art as described above, there are no regions where the interlayer insulating film 30 comes in contact directly with the tungsten film 42. As a result, an air-gap forming between the interlayer insulating film 30 and the tungsten film 42 is prevented.

Figure 2:
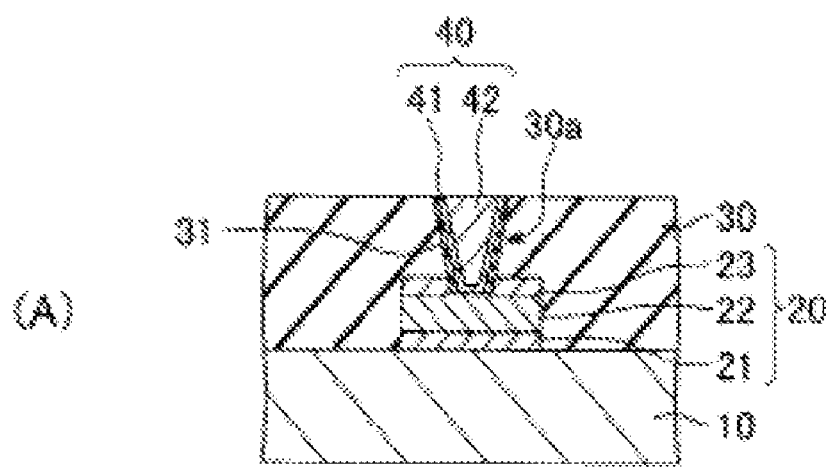
FIG. 2A is a sectional view for explaining a process subsequent to FIG. 1C.
FIG. 2B is a sectional view for explaining a process subsequent to FIG. 2A.
Figure 2:
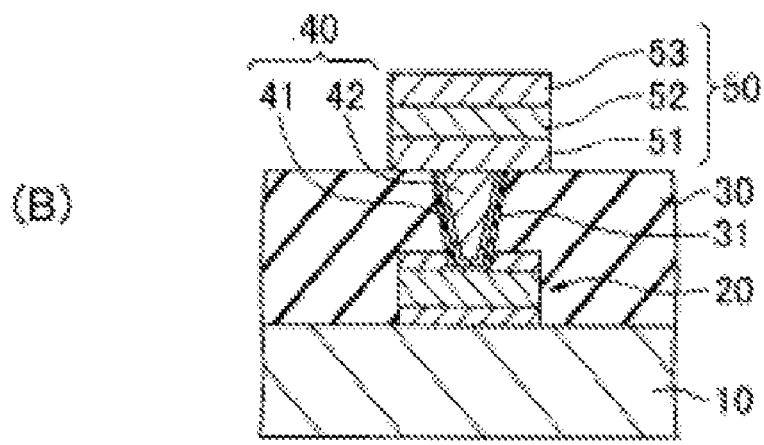

Then, as shown in FIG. 2A, the barrier film 41 and the tungsten film 42 on the interlayer insulating film 30 are removed by polishing using CMP, which completes a tungsten plug 40 deposited in the contact hole 30a.

Subsequently, as shown in FIG. 2B, a barrier film 51, an AlCu alloy film 52 and an antireflection film 53 are deposited in this order on the interlayer insulating film 30 and the tungsten plug 40. Structures and manufacturing methods for these layers are the same as those for the barrier film 21, the AlCu alloy film 22 and the antireflection film 23, respectively.

Next, a photoresist film (not shown) is applied to the antireflection film 53, and then the photoresist film is exposed and developed. A resist pattern is thus formed on the antireflection film 53. Then, the antireflection film 53, the AlCu alloy film 52 and the barrier film 51 are etched using this resist pattern as a mask. Thus a second wiring layer 50 is formed on the interlayer insulating film 30 so as to be on the tungsten plug 40. The resist pattern is removed thereafter.

According to the first embodiment of the invention, the coating 31 is formed on the sidewall of the contact hole 30a by sputtering the exposed section of the antireflection film 23 at the bottom of the contact hole 30a. Thus coverage of the barrier film 41 formed on the sidewall of the contact hole 30a is improved compared to methods in related art. Consequently, an air-gap forming between the tungsten film 42 and the sidewall of the contact hole 30a can be prevented. Accordingly, adhesiveness between the sidewall of the contact hole 30a and the tungsten plug 40 is enhanced, and stress migration characteristics and electromigration characteristics of the tungsten plug 40 are improved.

Figure 3:
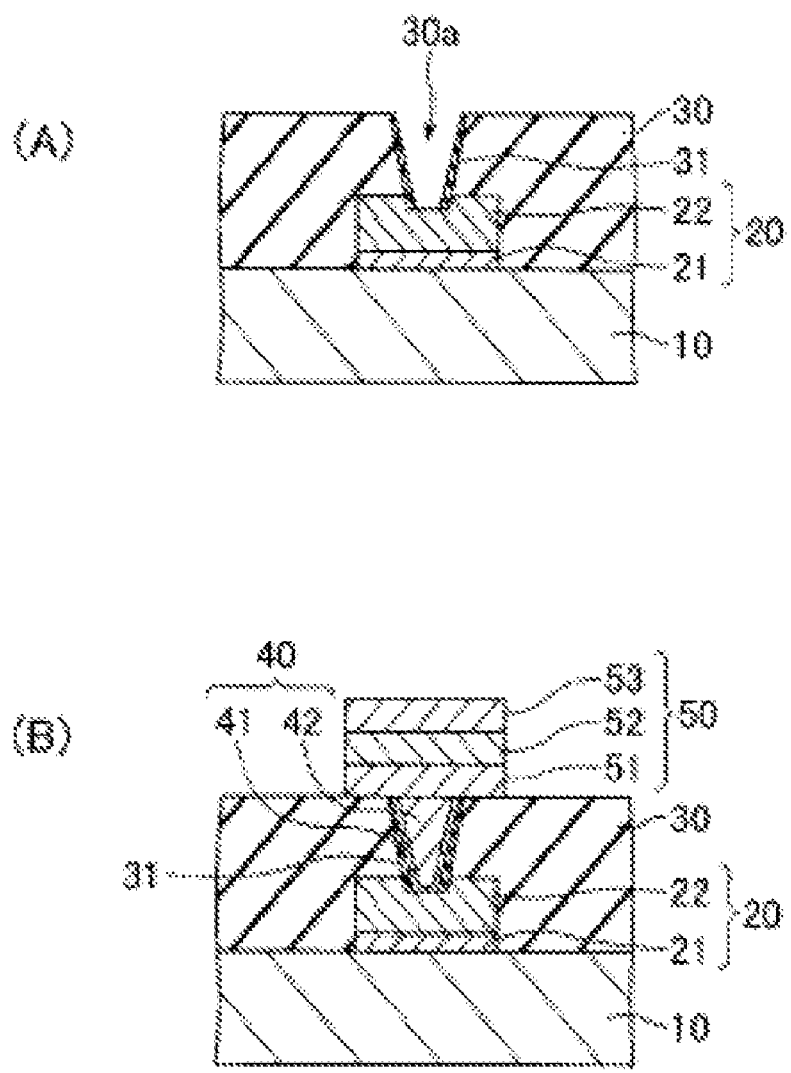
FIG. 3A is a sectional view for explaining a method for manufacturing a semiconductor device according to a second embodiment of the invention.
FIG. 3B is a sectional view for explaining a process subsequent to FIG. 3A.
Figure 4:
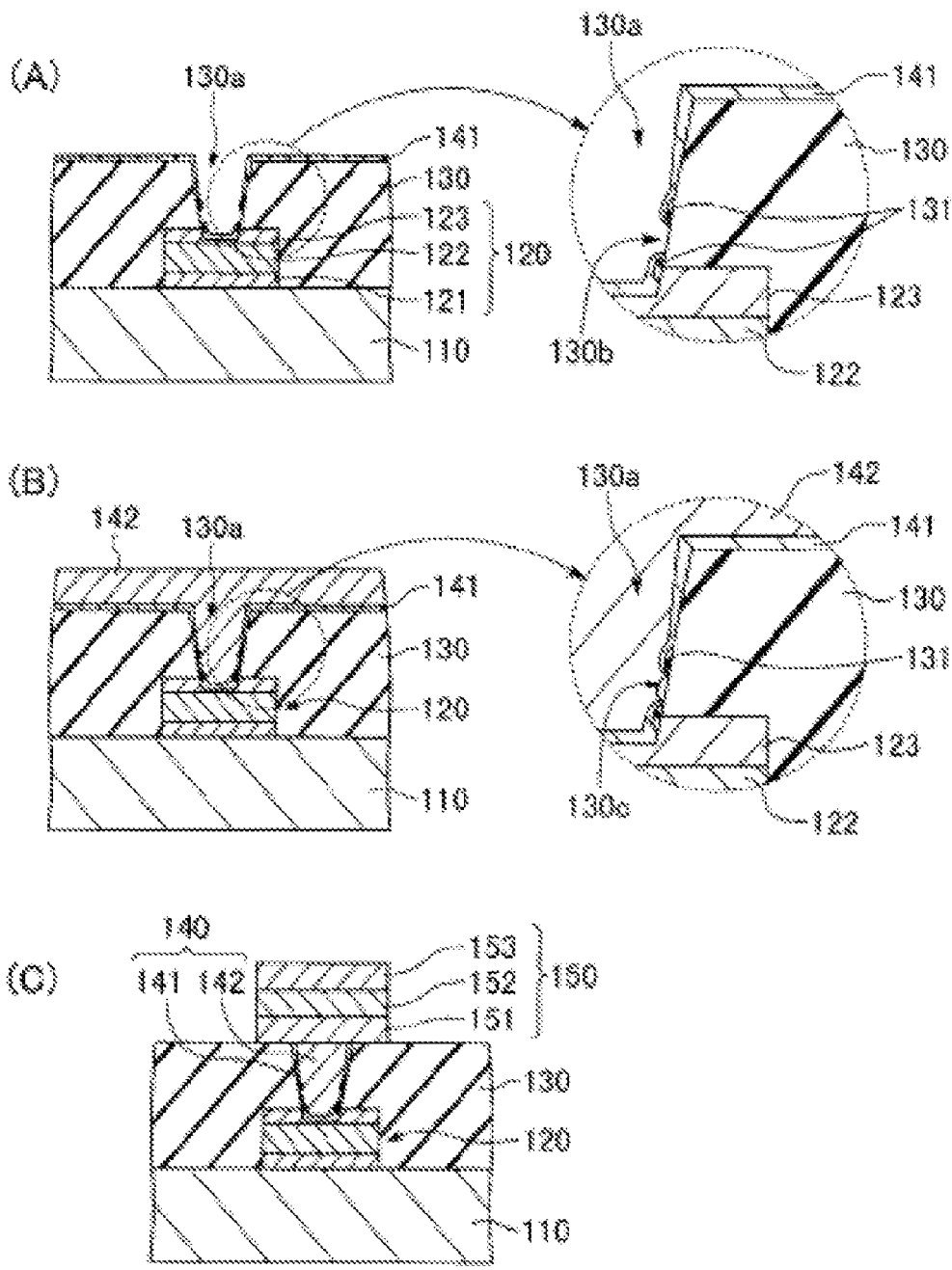
FIG. 4A is a sectional view for explaining a method for manufacturing a semiconductor device concerning related art.
FIG. 4B is a sectional view for explaining a process subsequent to FIG. 4A.
FIG. 4C is a sectional view for explaining a process subsequent to FIG. 4B.

FIGS. 3A and 3B are sectional views for explaining a method for manufacturing a semiconductor device according to a second embodiment of the invention. The present embodiment has the same structure as that of the first embodiment except for the structure of the first wiring layer 20. As for the same structure as that of the first embodiment, the same numerals are given and the description thereof shall be omitted.

First, as shown in FIG. 3A, the insulating film 10 and the first wiring layer 20 are formed. Then, the interlayer insulating film 30 and the contact hole 30a are formed. Next, by performing etching using the resist pattern used to form the contact hole 30a as a mask, the antireflection film 23 (shown in the first embodiment) is removed from the first wiring layer 20 at the bottom of the contact hole 30a. In this process, both the TiN film and the Ti film of the antireflection film 23 are removed.

Subsequently, the coating 31 is formed on the sidewall of the contact hole 30a by sputtering an exposed section of the AlCu alloy film 22 at the bottom of the contact hole 30a. The structure of the coating 31 is the same as that of the first embodiment except for the composition thereof. In the present embodiment, the coating 31 includes Al, Cu and O.

Then, as shown in FIG. 3B, the tungsten plug 40 and the second wiring layer 50 are formed. Structures and methods for forming these layers are the same as those in the first embodiment.

The present embodiment can provide the same advantageous effects as those of the first embodiment.

It should be understood that the above-mentioned embodiments and examples are not intended to limit the invention. Various changes and modifications can be made without departing from the spirit and scope of the invention. For example, at the removal process of the antireflection film 23 at the bottom of the contact hole 30a in the second embodiment, the Ti film can remain and also a portion of the Tin film and the Ti film can remain. In this case, the coating 31 includes Al, Cu, Ti and O.

What is claimed is:

1. A semiconductor device, comprising:
    a wiring formed on a first insulating film;
    a second insulating film formed on the first insulating film and on the wiring, the second insulating film having a contact hole on the wiring;
    a film formed on a side surface of the contact hole;
    a first barrier film formed on the film and the wiring; and
    a plug formed in the contact hole,
    wherein the first barrier film directly contacts the wiring at a bottom of the contact hole; and
    wherein the film is progressively thinner from the bottom to a top of the contact hole.

2. The device according to claim 1, wherein the wiring includes a TiN film, and the first barrier film directly contacts the TiN film at the bottom of the contact hole.

3. The device according to claim 1, wherein the wiring includes a Ti film, and the first barrier film directly contacts the Ti film at the bottom of the contact hole.

4. The device according to claim 1, wherein the wiring includes an alloy film including Al, and the first barrier film directly contacts the alloy film at the bottom of the contact hole.

5. The device according to claim 1, wherein the film is not island shaped.

6. The device according to claim 1, wherein the film is formed on an entire surface of the contact hole.

7. The device according to claim 1, wherein the film is not formed on a part of an upper side surface of the contact hole.

8. The device according to claim 1, wherein the wiring includes:
    a second barrier film formed on the first insulating film;
    an alloy film including Al is formed on the second barrier layer; and
    an antireflection film is formed on the alloy film.

9. The device according to claim 1, wherein the film includes Ti and O.

10. The device according to claim 1, wherein the film includes Al and O.

11. The device according to claim 1, wherein the film includes Ti, N and O.

12. The device according to claim 1, wherein the film includes O.

13. A semiconductor device comprising:

a wiring formed on a first insulating film;

a second insulating film formed on the first insulating film and on the wiring, the second insulating film having a contact hole on the wiring;

a first film formed on a side surface of the contact hole;

a second film formed on the first film and the wiring, the second film directly contacting the wiring at a bottom of the contact hole; and a plug formed in the contact hole, the first film having a first portion and a second portion disposed above the first portion in the contact hole, and a horizontal thickness of the first portion being thicker than a horizontal thickness of the second portion.

* * * * *